(12) United States Patent
Brandl et al.

(10) Patent No.: US 9,035,731 B2
(45) Date of Patent: May 19, 2015

(54) SPRING, PARTICULARLY FOR A PUSH BUTTON

(75) Inventors: Manfred Brandl, Gratwein (AT); Jean Marc Lucchini, Empersdorf (AT)

(73) Assignee: ams AG, Unterpremstaetten (AT)

( * ) Notice: Subject to any disclaimer, the term of this patent is extended or adjusted under 35 U.S.C. 154(b) by 10 days.

(21) Appl. No.: 13/809,156

(22) PCT Filed: Jul. 8, 2011

(86) PCT No.: PCT/EP2011/061629
§ 371 (c)(1),
(2), (4) Date: Mar. 20, 2013

(87) PCT Pub. No.: WO2012/004386
PCT Pub. Date: Jan. 12, 2012

(65) Prior Publication Data
US 2013/0194028 A1    Aug. 1, 2013

(30) Foreign Application Priority Data
Jul. 8, 2010 (DE) .......................... 10 2010 026 516

(51) Int. Cl.
| | |
|---|---|
| *H01H 9/02* | (2006.01) |
| *F16H 21/44* | (2006.01) |
| *F16F 1/02* | (2006.01) |
| *G01D 5/14* | (2006.01) |
| *G01L 1/04* | (2006.01) |
| *H03K 17/96* | (2006.01) |
| *H03K 17/97* | (2006.01) |
| *G01L 1/12* | (2006.01) |

(52) U.S. Cl.
CPC ........... *F16H 21/44* (2013.01); *Y10T 74/18992* (2015.01); *F16F 1/025* (2013.01); *G01D 5/145* (2013.01); *G01L 1/044* (2013.01); *H03K 17/96* (2013.01); *H03K 17/97* (2013.01); *H03K 2217/96038* (2013.01); *G01L 1/122* (2013.01)

(58) Field of Classification Search
USPC ................................... 335/205–207, 151–154
See application file for complete search history.

(56) References Cited

U.S. PATENT DOCUMENTS

| | | | | |
|---|---|---|---|---|
| 3,621,415 A | * | 11/1971 | Bell | ............................... 335/205 |
| 5,545,864 A | | 8/1996 | Bauer et al. | |
| 6,670,873 B2 | * | 12/2003 | Inada et al. | ................... 335/205 |

FOREIGN PATENT DOCUMENTS

| | | |
|---|---|---|
| DE | 2359971 | 6/1975 |
| DE | 4330576 | 11/1994 |
| JP | 54-68174 U | 5/1979 |
| JP | 56148824 | 11/1981 |
| JP | 08017286 A * | 1/1996 |
| JP | 11-007860 | 1/1999 |
| JP | 2003-197078 A | 7/2003 |
| JP | 2008-021528 A | 1/2008 |
| JP | 2008017286 | 1/2008 |
| JP | 2008214800 | 9/2008 |

* cited by examiner

*Primary Examiner* — Bernard Rojas
(74) *Attorney, Agent, or Firm* — McDermott Will & Emery LLP

(57) ABSTRACT

The invention relates to a spring (1), in particular for a push button, for fixing to a carrier (2) and for registering a vertical force (F). The spring (3) is designed in such a way that when actuated it converts a vertical movement into a horizontal movement that can be detected by sensor means (4).

8 Claims, 4 Drawing Sheets

Figure 1:
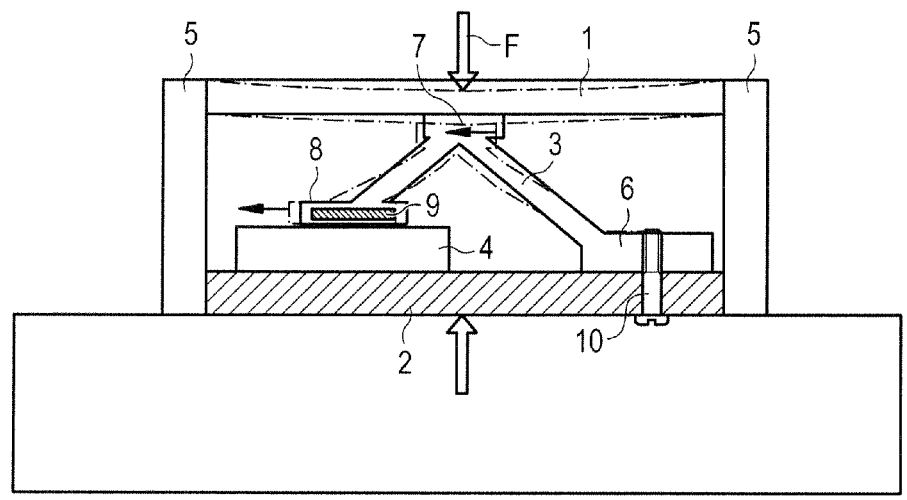

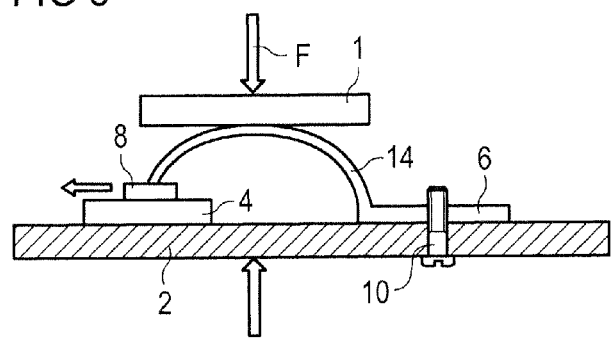
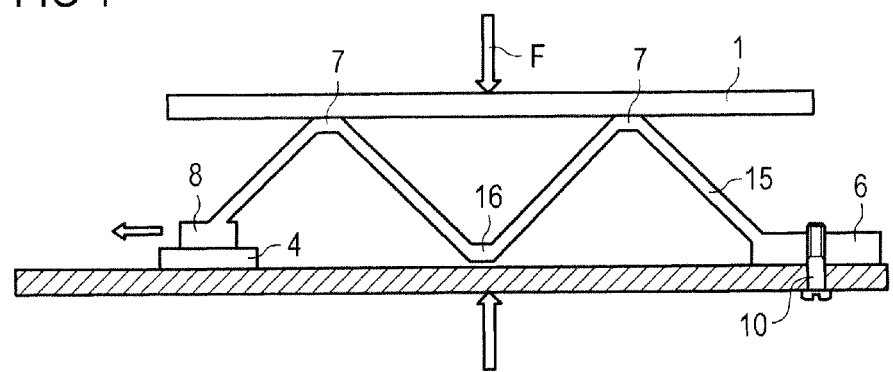

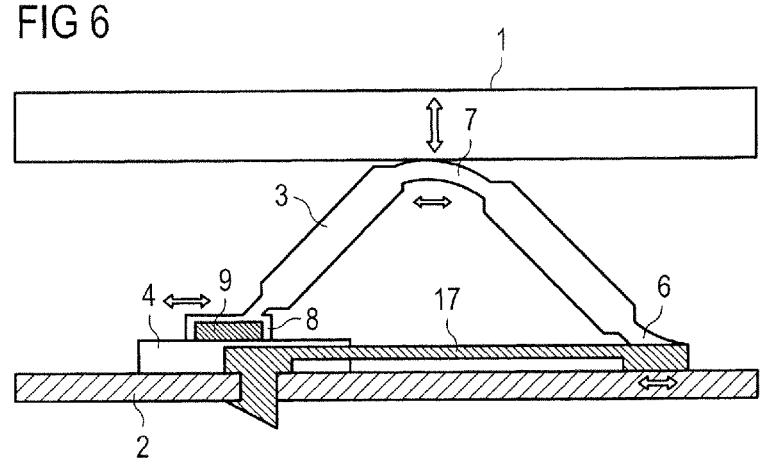
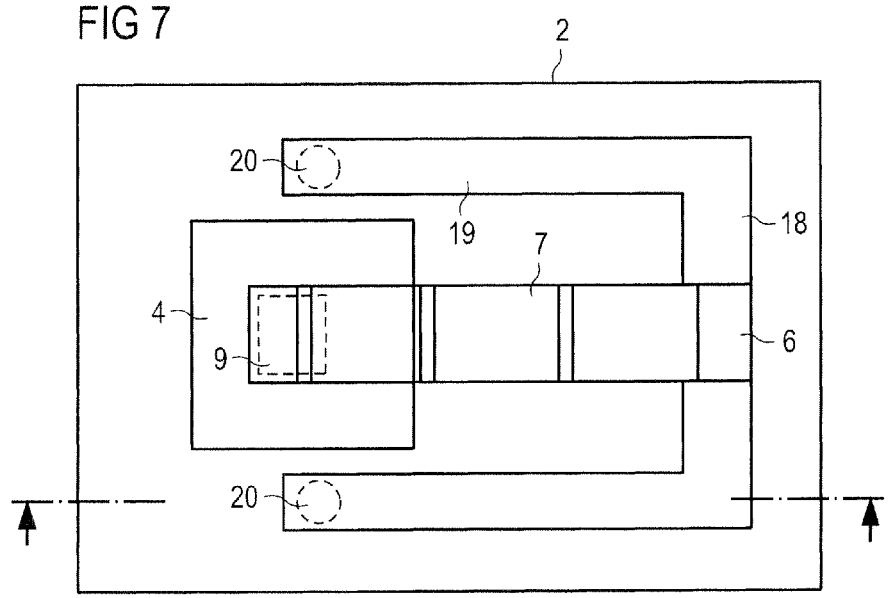

SPRING, PARTICULARLY FOR A PUSH BUTTON

The present invention pertains to a spring, in particular, to a pushbutton, a spring arrangement and a button arrangement.

Pushbuttons are used for numerous applications in order to convert human commands into electrical signals. Contactless pushbuttons have proven to be successful for ensuring a reliable operation over several years. These pushbuttons are currently available in the form of capacitive, optical and inductive proximity switches.

A small structural height of the pushbutton is desirable due to the increasing miniaturization, for example, of portable devices such as mobile telephones. In addition, design aspects need to be taken into consideration such as, for example, a flat structural shape of the housing.

It is the objective of the present invention to disclose a spring, a spring arrangement and a button arrangement that make it possible to detect an actuation of the pushbutton in a contactless fashion and to realize small structural heights.

This objective is attained with the objects of the independent claims. Embodiments and enhancements of the proposed principle are disclosed in the respective dependent claims.

In an embodiment, the spring suitable, in particular, for use in a pushbutton is designed for mounting on a carrier and for detecting a vertical force during an actuation of the pushbutton. In this case, the spring is designed in such a way that it converts a vertical motion into a horizontal motion when the pushbutton is actuated. The horizontal motion can be detected by a sensor means.

A very small structural height of the pushbutton can be achieved due to the conversion of the vertical force into a horizontal force. In this case, the detection of the horizontal motion by a sensor means moreover makes it possible to detect an actuation in a contactless fashion.

The proposed spring makes it possible to realize a pushbutton function that allows a reliable contactless detection and at the same time only requires a slight vertical motion in order to trigger an actuation. The proposed principle moreover makes it possible to detect an actuation of a pushbutton with low sensitivity to electromagnetic interference fields, temperature changes and humidity. The small structural height and the simple function resulting from the conversion of a vertical motion into a horizontal motion moreover allow a simple system integration, assembly, test and calibration.

The conversion of the vertical motion into a horizontal motion is preferably realized by means of an elastic deformation of the spring. The elastic deformation may moreover generate a restoring force that causes the spring to return into its initial position or idle position after an actuation.

In an enhancement, the spring comprises at least one mounting area for being mounted on the carrier. The mounting may be realized, for example, by means of a screw. In addition, it is preferred to provide at least one sliding area for sliding the spring over the sensor means. In this way, the mechanical actuation is ultimately converted into an electrical signal. Furthermore, at least one force input area is provided in order to introduce into the spring the force exerted in the vertical direction during the actuation. In this respect, it would also be possible to realize a sliding motion of the force input area relative to, for example, a glass plate above the spring.

In an exemplary embodiment, the force input area is connected to the mounting area on the one hand and to the sliding area of the spring on the other hand by means of one respective leg of the spring. The design of the spring, particularly the angle between the two spring legs relative to the vertical line, is decisive with respect to the fact of whether a mechanical intensification or attenuation is realized during the conversion of the vertical motion into a horizontal motion.

The spring is preferably manufactured in one piece, i.e., without joints or hinges. Consequently, no mechanical play occurs during the conversion of the vertical motion into a horizontal motion. A slight hysteresis may occur in a few embodiments due to mechanical friction. Mechanical friction may occur in the force input area and, in particular, also in the sliding area of the spring.

The spring is preferably manufactured of a material that has a thermal expansion similar or identical to that of a housing that surrounds the spring. For example, this material may comprise a plastic or Teflon. In this case, the materials are chosen such that the coefficients of thermal expansion are adapted to one another and, for example, materials with identical or similar coefficients of expansion are chosen for the spring and the housing.

The spring preferably can be elastically deformed and thusly generates a restoring moment for returning the spring into an initial position after the end of an actuation.

The sliding area of the spring is preferably designed for accommodating a magnet. This makes it possible to detect the motion converted into the horizontal direction in a contactless fashion by means of a magnetic sensor such as, for example, a Hall sensor.

Alternatively, the sliding area of the spring could also comprise the sensor means, wherein the magnet is mounted on the carrier in this case.

The spring may be realized, for example, in an essentially V-shaped fashion, wherein the ends of the V respectively represent the mounting area and the sliding area and the center of the V represents the force input area. The force input area is connected to the mounting area and the sliding area via one respective leg.

In order to achieve a greater mechanical intensification during the conversion of the vertical motion into a horizontal motion, it would be possible to realize a W rather than a V such that a W-shaped spring is used in this case.

A production-related realization consists, for example, of a U-shaped spring that can be manufactured in one piece with little effort and low cost and is able to realize the relevant motion in the form of an elastic deformation without plastic deformation.

In another embodiment, a spring arrangement comprises a spring of the above-described type. In addition, a compensation means that is rigidly connected to the mounting area of the spring and extends in the horizontal direction is provided, wherein the compensation means is designed for being stationarily mounted on the carrier. The coefficient of expansion of the compensation means is adapted to the coefficient of expansion of the spring in such a way that temperature-related influences on the detection of the horizontal motion with the sensor means are completely or largely compensated.

For example, the compensation means is rigidly connected to the carrier on one end while its other end is movably arranged such that it can slide over the carrier. The mounting area of the spring is fixed on this end. In this way, the expansion behavior of the spring is largely compensated in the horizontal plane during a thermal expansion. This makes it possible to ensure, for example, that the magnet is always situated above the detection area of the sensor means such that an actuation of the pushbutton can be reliably detected under highly diverse temperature conditions.

In a vertical projection, the compensation means may be realized, for example, in a U-shaped fashion and feature legs that are connected to the mounting area of the spring in a connecting area. The legs may feature means for being stationarily mounted on the carrier on their free ends. These may consist, for example, of clips, screw connections or similar stationary connections.

It is particularly preferred that the spring or the spring arrangement can be respectively utilized in a button arrangement, particularly for a pushbutton. Such a button arrangement comprises a spring or a spring arrangement of the above-described type. In this case, the carrier is respectively connected to the mounting area of the spring directly or via the compensation means of the spring arrangement—if such compensation means are provided. In addition, a magnet is provided and connected to the sliding area of the spring, wherein a sensor means is moreover mounted on the carrier in order to detect a horizontal motion of the magnet in dependence on a vertical motion of the force input area of the spring.

For example, the force input area of the spring is non-positively connected to an actuating element of the button arrangement.

This actuating element may be realized, for example, in the form of a glass plate that essentially is aligned horizontally or another cover. Glass plates are widely used, for example, in mobile telephones, in which case they serve for realizing a large touch-sensitive surface that operates in a resistive or nowadays increasingly capacitive fashion.

A large capacitive touch-sensitive surface requires a relatively high static current. The proposed principle is particularly advantageous in this respect because the spring makes it possible to combine a pushbutton with the touch-sensitive surface. The pushbutton may serve, for example, for activating the device in an idle state thereof and for switching on the large touch-sensitive surface.

Due to the non-positive connection, an actuation of the glass plate in the form of a vertical motion directly leads to a vertical motion of the force input area of the spring that, in turn, leads to a horizontal motion of the sliding area of the spring that is detected with the sensor means and therefore converted into an electrical signal.

The sensor means comprises, for example, at least one Hall sensor that detects a horizontal motion of the magnet and makes available a sensor signal at a sensor output of the sensor means in dependence on a horizontal motion of the magnet.

The sensor means may consist, for example, of magnetic linear position sensor that consequently allows a highly robust and contactless operation. To this end, a permanent magnet that comprises at least one north pole and south pole may be mounted on the free end of the spring that is referred to as sliding area. The sensor means detects a horizontal change in position of the magnet relative to the sensor means.

Several exemplary embodiments of the invention are described in greater detail below with reference to the figures.

Figure 2:
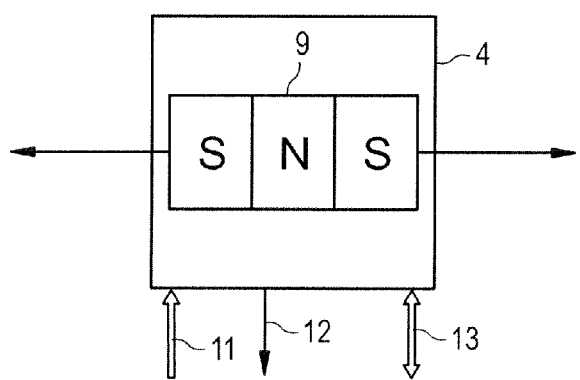
Figure 5:
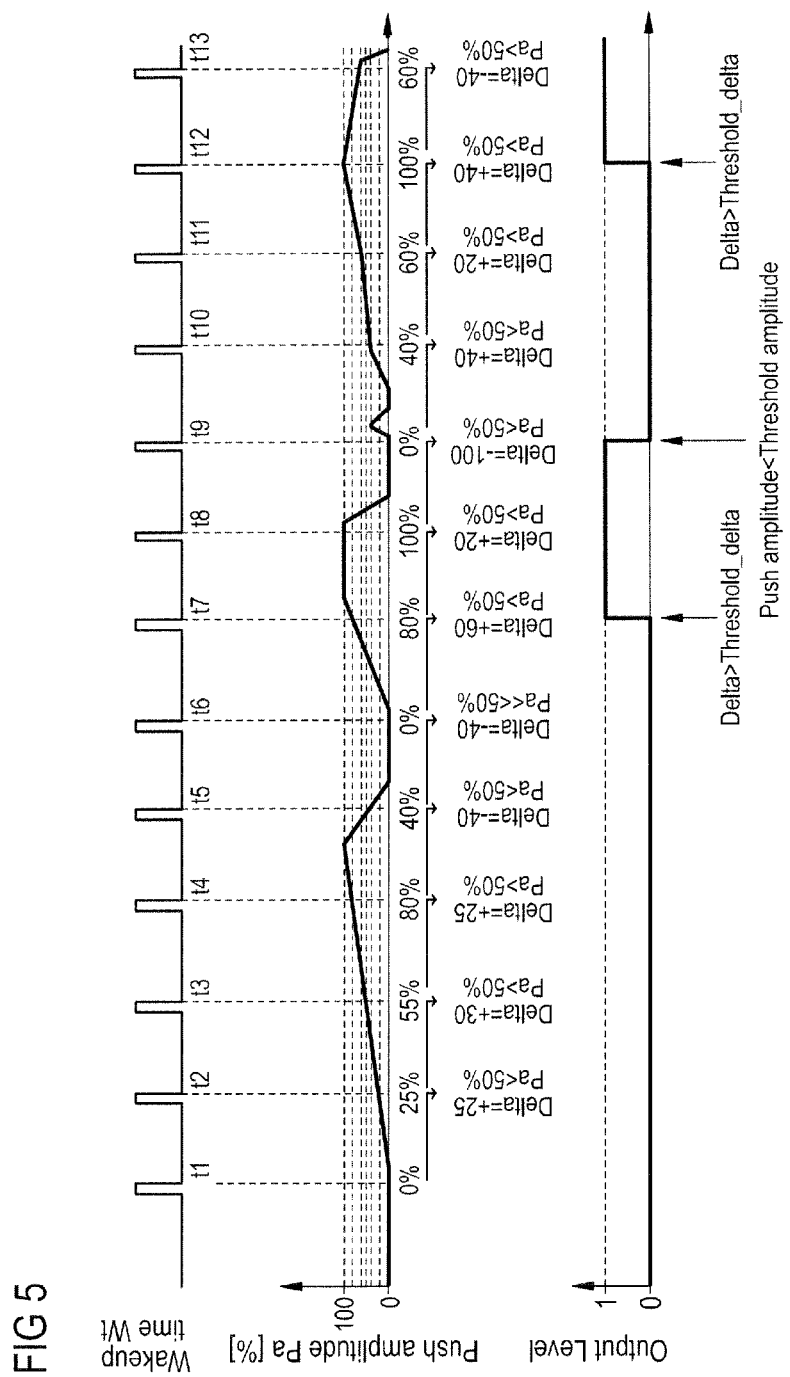

In these figures:

FIG. 1 shows an exemplary embodiment of a button arrangement with a spring according to the proposed principle, FIG. 2 shows an exemplary embodiment of a magnet and a sensor means suitable for use in the button arrangement according to FIG. 1, FIG. 3 shows another exemplary embodiment of a spring, FIG. 4 shows yet another exemplary embodiment of a spring, FIG. 5 shows exemplary signal curves for the operation of the sensor means, FIG. 6 shows an alternative embodiment of the button arrangement with a spring arrangement in the form of a cross section, and FIG. 7 shows a top view of the embodiment according to FIG. 6.

FIG. 1 shows an exemplary embodiment of a button arrangement with a spring according to the proposed principle. The spring consists of a V-shaped spring 3 that is accommodated in an essentially cuboid housing 1, 2, 5 together with a sensor means 4.

The spring 3 specifically comprises a mounting area 6 that is arranged on the end of one of two legs of the V-shaped spring 3. The two legs of the spring 3 are connected to one another in a force input area 7. A sliding area 8, in which a magnet 9 is arranged, is realized on the free end of the second spring leg. The force input area 7, as well as the mounting area 6 and the sliding area 8 of the spring, is flattened in the horizontal direction toward the outer side of the spring. The outer regions of the mounting area, the sliding area and the force input area are realized with essentially parallel surfaces.

The mounting area 6 of the spring is mounted on the carrier 2 that forms the housing together with two sidewalls 5 and an actuating plate 1. Two other sidewalls of the housing are not visible in FIG. 1 due to the sectional representation. The mounting is realized with a screw connection 10 produced with a screw that is screwed into a thread provided in the mounting area 6 through a drilled hole in the carrier plate 2.

The sensor means 4 that is connected to the carrier 2 over a large surface, for example, by means of soldering or bonding is arranged underneath the sliding area 8. The sensor means 4 may be realized, for example, in the form of an integrated circuit. No rigid mechanical connection is provided between the sliding area 8 and the sensor means 4, but the sliding area 8 rather is able to slide over the sensor means in essentially the horizontal direction. This applies analogously to the force input area 7 of the spring that non-positively adjoins the actuating plate 1, wherein the mounting area travels a shorter distance in the horizontal direction than the sliding area during an actuation due to the geometry of the spring.

An excursion of the spring in the horizontal direction takes place during an actuation in the vertical direction, for example, by centrally exerting a force F upon the actuating plate 1 as illustrated in FIG. 1. In more specific terms, the mounting area 6 of the spring remains stationary during an actuation while the force input area 7 carries out a slight horizontal excursion toward the left relative to the mounting area and the sliding area 8 of the spring likewise carries out a correspondingly intensified horizontal excursion toward the left. The motion is indicated with corresponding horizontal arrows. The actuation causes a displacement of the actuating plate 1, as well as at least large portions of the spring, in the above-described fashion, namely into a new position that is illustrated with broken lines in FIG. 1. The idle position of the spring, in contrast, is illustrated with continuous lines. The actuating plate 1, as well as the spring, is subjected to an elastic deformation during an actuation. Once the actuating force F ceases, the actuating plate 1 and the spring 3, particularly the force input area 7 and the sliding area 8, return into the initial position.

The spring 3 is realized in one piece. The elastic deformation generates a restoring moment that causes the spring to return into the initial position after the end of an actuation.

The complete arrangement consisting of the spring 3, the magnet 9, the sensor means 4 and the housing 1, 2, 5 is referred to as button arrangement. Since the horizontal motion of the magnet 9 is detected by the sensor means 4 in a contactless fashion, this button arrangement by and large concerns a contactless pushbutton. The sensor means 4 features not-shown terminals that comprise at least one signal output.

During the operation of the button arrangement, a signal that indicates a motion of the magnet 9 relative to the sensor means 4 is made available at the signal output such that an electrical signal is ultimately generated in dependence on a human actuation of the pushbutton.

In other words, a reduction in the vertical distance between the actuating plate 1 and the carrier plate 2 that essentially lie parallel to one another due to an externally applied force causes the spring to be elastically deformed in such a way that it expands horizontally toward the left. Consequently, a vertical motion is converted into a lateral or horizontal motion.

The geometry of the spring 3, particularly the angle between the two legs of the spring, makes it possible to specify whether a differential motion between the actuating plate 1 and the carrier 2 is intensified or attenuated referred to the horizontal deflection of the sliding area 8 of the spring.

In FIG. 1, the spring 3 is realized in one piece in the form of a solid body and features no joints. Consequently, no mechanical play occurs during the conversion of the vertical motion of the actuating plate into a horizontal motion that can be detected. A hysteresis of the motion may remain due to friction on the two contact surfaces between the force input area 7 and the actuating plate 1 on the one hand and between the sliding area 8 and the sensor means 4 on the other hand. In the present embodiment, the spring is made of a material with a coefficient of thermal expansion that is identical or similar to that of the sidewalls 5 of the housing in order to prevent a temperature drift of the button arrangement. For example, materials such as plastics or Teflon may be considered in this respect.

In the present embodiment, the sensor means 4 is realized in the form of a magnetic linear position sensor and designed for a robust and contactless operation. For this purpose, a permanent magnet 9 is arranged on the free end in the sliding area of the spring 3. In this way, vertical changes in position relative to the sensor means are detected.

Due to the conversion of a vertical motion into a horizontal motion and the detection in the horizontal direction, the pushbutton according to FIG. 1 has a small structural height and a low power consumption in battery-operated devices because the sensor means can be designed for a very low power consumption, for example, in the form of a Hall sensor. Only a single digital output is required. Time-based and amplitude-based algorithms that can be implemented in the sensor means and are described in greater detail below are available for detecting the depressed state of the button. According to an enhancement, an optional communication port is provided on the sensor means in order to adjust parameters of the algorithm. This makes it possible to adjust time threshold values and/or amplitude threshold values.

Other advantages can be seen in the low sensitivity of the button to interferences such as external magnetic fields, temperature changes and humidity, as well as its superior properties with respect to electromagnetic compatibility. For example, the presence of external magnetic fields can be respectively canceled or compensated by means of a differential detection with two Hall sensors.

The design according to FIG. 1 can be manufactured, tested and calibrated with little effort and also allows a simple system integration, for example, in mobile devices.

Alternatively to the embodiment illustrated in FIG. 1, in which an essentially rectangular or cuboid housing 1, 2, and a V-shaped spring are provided, it would also be conceivable to realize other geometric embodiments of the spring and the housing that correspond to the basic principle of the proposed spring and button arrangement, namely the conversion of a vertical pressure exerted during the actuation of a pushbutton into a horizontal motion by means of mechanical measures of a spring and a contactless detection of the horizontal excursion with a sensor means.

FIG. 2 shows an exemplary embodiment of a magnet 9 arranged above a sensor means 4. FIG. 1 shows a cross section through a button arrangement while FIG. 2 shows a top view of a detail of FIG. 1, namely the magnet 9 arranged above the sensor means 4 only in order to elucidate the sensor principle, i.e., the detection of a horizontal motion. Other components, particularly the spring 3, are not illustrated in this figure.

The magnet 9 consists of a linear magnet and presently comprises several magnetic poles N, S, of which only one north pole N is illustrated between two south poles S in order to simplify the illustration. The magnet can be horizontally displaced in the direction of the arrow[s] as already elucidated above with reference to FIG. 1. The sensor means 4 consist of an integrated circuit in the form of a sensor IC and comprises several Hall sensors, as well as evaluation electronics connected thereto. The sensor means furthermore comprises terminals for its voltage supply 11, at least one signal output 12 and a communication port 13 for its optional configuration.

The sensor means 4 consists of a linear sensor that can detect the horizontal displacement of the magnet 9 above the sensor. Hall elements in the sensor means are periodically activated, for example, with an oscillator that is designed for low power consumption in order to measure the magnet position and are deactivated again at the end of each measurement in order to save energy.

The duration between two activation processes is periodic and may either be pre-adjusted or adjusted during the operation. Likewise, threshold values for the duration and the amplitude of the detection may either be permanently adjusted in a register or adjusted during the operation via the communication port. If the periodic duration and the register values are permanently programmed, it would be possible, for example, to carry out a one-time programming by means of so-called fuses. This is also referred to as one-time programming (OTP).

A position measurement is carried out for each period Wt, in which the Hall elements are activated, and a result Pa(t) for this time t is determined. The Hall elements are once again deactivated at the end of each measurement and a differential value Delta(t) is determined. This differential value is obtained by forming the difference between successive position measurements Pa(t)−Pa(t−1). The value at the signal output 12 changes in dependence on the following conditions:

1. If the difference Delta(t) is greater than the threshold value Delta Schwelle and if the amplitude of the measured value Pa(t) is greater than the threshold value of the amplitude Pa_Schwelle, the signal output is switched into the active state. If the signal amplitude Pa(t) is lower than the threshold value of the signal amplitude Pa_Schwelle, the output is switched into the inactive state.

2. The algorithm may alternatively be configured as follows: if the amplitude of the measured value Pa(t) is greater than the threshold value of the amplitude Pa_Schwelle, the output is switched into the active state. If the value of the amplitude of the measured signal Pa(t) is lower than the threshold value for the amplitude Pa_Schwelle, the output is switched into the inactive state.

The additional condition that the time interval between two measured values needs to be greater than a threshold value prevents the undesirable state of a detected actuation in the case of slow changes in motion such as, for example, temperature changes, accidental actuations in a holster of the mobile device, external magnetic fields or parasitic mechanical motions.

FIG. 3 shows an alternative embodiment of the spring according to FIG. 1 that is not realized in a V-shaped fashion, but rather in a U-shaped fashion in this case and identified by the reference symbol 14. In other words, the cross-sectional shape of the spring is not defined by an upside down V, but rather by an upside down U. The U-shaped spring 14 likewise features an identical flat mounting area 6 that may also be interpreted as a flange and is once again mounted on the carrier plate 2 by means of a screw connection 10. The spring is again manufactured in one piece. The force input area is formed by the bottom of the "U" and may alternatively also be slightly flattened in order to produce a better non-positive connection with the actuating plate 1.

In this case, a vertical motion caused by acting upon the actuating plate 1 with a force F also leads to a horizontal motion of the sliding area 8 of the U-shaped spring 14 above a sensor means 4.

The U-shaped design of the spring 14 is particularly suitable for a one-piece industrial manufacture and, in comparison with the V-shaped design according to FIG. 1, has the advantage that a point of the spring that is subjected to particularly high mechanical stresses and lies in the force input area at the convergence of the two spring legs according to FIG. 1 is avoided in the U-shaped embodiment. In addition, an improved spring effect, i.e., a larger elastically deformable area, is achieved.

FIG. 4 shows yet another exemplary embodiment of the spring that is realized in a W-shaped fashion in FIG. 4 and identified by the reference symbol 15. Due to the W-shaped design, not only one force input area is provided as is the case in FIG. 1, but rather two force input areas 7 that are respectively flattened and non-positively adjoin the actuating plate 1. The same flange-like mounting area 6 is provided oppositely on the side of the carrier 2, but an additional sliding area is provided in the center of the W-shaped spring 16. The sliding area that accommodates the magnet is realized in the same fashion as described above and can horizontally slide above the sensor means 4. This figure clearly shows that the W-shaped design mechanically intensifies the actuation, i.e., a very slight actuation over a short distance in the vertical direction leads to a significant excursion of the sliding area 8 and the magnet 9 in the horizontal direction. Consequently, an actuation can also be reliably detected by means of the sensors if only slight excursions occur such that the required structural height of the pushbutton arrangement can be additionally reduced.

A spring may ultimately be realized with not only two legs, but rather a plurality of legs in order to ensure a mechanical intensification during the conversion of the vertical motion into a horizontal motion.

FIG. 5 shows an exemplary signal flow diagram for elucidating the function of detecting an actuation of the pushbutton. The upper signal is a periodic pulse with the clock period Wt such that the sensor means, particularly the Hall sensors, are respectively periodically switched on at the successive points in time t1, t2, t3 . . .

In the central region of the signals, an amplitude is plotted as a function of the time that corresponds to the intensity of the actuation of the pushbutton and is proportional to the detected amplitude Pa(t) in the sensor means. In order to simplify the illustration, it is normalized, and in the example shown, changes arbitrarily between 0 and 100% in order to run through different actuating scenarios.

The level of the output signal at the signal output 12 of the sensor means is ultimately shown on the bottom. This figure clearly shows that the slow rise of the amplitude between the points in time t1 and t4 is not detected as an intentional actuation of the pushbutton. The signal output remains at logic 0. Only the significant rise between the points in time t6 and t7 is detected as an intentional actuation and, vice versa, the drop from 100% to 0% between t8 and t9 is detected as a release of the pushbutton.

For this purpose, the register for the threshold value Delta Schwelle was set, for example, to 40% and the register for the threshold value of the amplitude Pa_Schwelle was set to 50%. The amplitude of the actuation was set to 0% in the idle state, i.e., while the pushbutton was not depressed. In this case, 100% amplitude corresponds to the fully depressed pushbutton when the magnet is horizontally displaced as far as possible.

FIG. 6 shows an enhancement of the mounting of the spring that is arranged in a spring arrangement in this case. The actuating plate 1, the carrier plate 2 extending parallel thereto, the sensor means 4 and the spring 3 with the mounting area 6, the force input area 7, the sliding area 8 featuring the magnet 9 and the two legs of the V-shaped spring are essentially not changed in comparison with FIG. 1, wherein the force input area consists of a thinner material and has a slight curvature in order to achieve a superior elastic deformation. In contrast to FIG. 1, the mounting area 6 in FIG. 6 is not directly connected to the carrier in a mechanically rigid fashion, but rather is arranged on a compensation means 17 that is also arranged essentially parallel to the carrier. On its free end, the compensation means 17 is mechanically connected to the carrier 2 in a rigid fashion, for example clipped therein as illustrated in FIG. 6. The region of the compensation means 17 that is directly mounted on the mounting area 6 can slide over the carrier in the horizontal direction. If the compensation means 17 consists of a material with a coefficient of thermal expansion that is adapted to that of the material of the spring 3, the horizontal expansion of the spring, for example, due to different operating or ambient temperatures is advantageously compensated. This ensures that the sensor means 4 and the magnet 9 assume the same position relative to one another in the idle position at different operating temperatures such that no further measures are required for ensuring a reliable detection at different temperatures.

The horizontal motion of the force input area is caused by thermal expansion only. The horizontal motion of the sliding area is not dependent on the temperature and only occurs due to a vertical actuation of the carrier plate 1. The force input area 7 carries out a vertical motion during an actuation, as well as a temperature-dependent horizontal motion caused by the compensation means and its thermal expansion.

FIG. 7 shows a top view of the embodiment illustrated in the form of a cross section in FIG. 6. According to this figure, the compensation means 17 is realized in a U-shaped fashion in this top view and features a central region 18 that essentially extends in a principal direction and to which two legs 19 are perpendicularly connected, wherein the ends of said legs respectively comprise a connection 20 in the form of a clip-in connection. This top view of the spring 3 shows the mounting area 6 that is rigidly connected to the compensation means, the force input area 7 and the magnet 9 that is illustrated with broken lines and is arranged in the sliding area 8 of the spring. The sensor means 4 is arranged underneath the magnet in an essentially square fashion.

LIST OF REFERENCE SYMBOLS

1 Actuating plate
2 Carrier

3 Spring
4 Sensor means
5 Sidewall
6 Mounting area
7 Force input area
8 Sliding area
9 Magnet
10 Screw
11 voltage supply terminal
12 Signal output
13 Communication port
14 U-shaped spring
15 Leg
16 Additional sliding region
17 Compensation means
18 Central part
19 Leg
20 Clip
N North pole
S South pole
Wt Clock period
Pa Measuring result

The invention claimed is:

1. A spring, particularly for a pushbutton, that is designed for mounting on a carrier and for detecting a vertical force, wherein the spring is realized in such a way that it converts a vertical motion into a horizontal motion that can be detected in a contactless fashion by a sensor means during an actuation of the pushbutton, the spring comprising:
at least one sliding area for sliding the spring over the sensor means, wherein the at least one sliding area of the spring is designed for accommodating a magnet;
at least one mounting area for mounting on the carrier;
at least one force input area for introducing the force exerted in the vertical direction into the spring; and
a compensation means that is rigidly connected to the mounting area of the spring and extends in the horizontal direction, wherein the compensation means is designed for being stationarily mounted on the carrier, and wherein the coefficient of thermal expansion of the compensation means is adapted to the coefficient of thermal expansion of the spring in such a way that temperature influences on the detection of the horizontal motion by the sensor means are compensated.

2. The spring according to claim 1, featuring a restoring moment for returning the spring into the initial position after the end of an actuation.

3. The spring according to claim 1, wherein the spring is essentially realized in a V-shaped fashion.

4. The spring according to claim 1, wherein the spring is essentially realized in a W-shaped fashion.

5. The spring according to claim 1, wherein the spring is essentially realized in a U-shaped fashion.

6. The spring arrangement according to claim 1, wherein the compensation means is realized in a U-shaped fashion and features legs that are connected to the mounting area of the spring in a connecting area, wherein the free ends of the legs feature means for being stationarily mounted on the carrier.

7. A button arrangement, comprising:
a spring or a spring arrangement according to claim 1;
the carrier that is respectively connected to the mounting area of the spring directly or via a compensation means which is connected to the mounting area of the spring;
the magnet that is connected to the sliding area; and
the sensor means that is mounted on the carrier and serves for detecting a horizontal motion of the magnet relative to the sensor means in a contactless fashion in dependence on a vertical motion of the force input area of the spring.

8. The button arrangement according to claim 7, wherein the sensor means comprises at least one Hall sensor that detects a horizontal motion of the magnet and makes available a sensor signal at a sensor output of the sensor means in dependence on such horizontal motion of the magnet.

* * * * *